(12) United States Patent
Kim et al.

(10) Patent No.: US 11,257,723 B2
(45) Date of Patent: Feb. 22, 2022

(54) INSPECTION SYSTEM AND METHOD FOR INSPECTING SEMICONDUCTOR PACKAGE, AND METHOD OF FABRICATING SEMICONDUCTOR PACKAGE

(71) Applicant: SAMSUNG ELECTRONICS CO., LTD., Suwon-si (KR)

(72) Inventors: Do-Hyun Kim, Suwon-si (KR); Sunwon Kang, Suwon-si (KR); Hogeon Song, Suwon-si (KR); Kyung Suk Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 79 days.

(21) Appl. No.: 16/698,160

(22) Filed: Nov. 27, 2019

(65) Prior Publication Data

US 2020/0373209 A1 Nov. 26, 2020

(30) Foreign Application Priority Data

May 21, 2019 (KR) .......................... 10-2019-0059215

(51) Int. Cl.
| | | |
|---|---|---|
| *H01L 23/544* | (2006.01) | |
| *H01L 21/18* | (2006.01) | |
| *H01L 21/304* | (2006.01) | |
| *H01L 21/66* | (2006.01) | |
| *H01L 21/67* | (2006.01) | |

(52) U.S. Cl.
CPC ............ *H01L 22/20* (2013.01); *H01L 21/187* (2013.01); *H01L 21/3043* (2013.01); *H01L 21/67282* (2013.01); *H01L 23/544* (2013.01)

(58) Field of Classification Search
CPC ..... H01L 22/20; H01L 23/544; H01L 21/187; H01L 21/3043; H01L 21/67282
See application file for complete search history.

(56) References Cited

U.S. PATENT DOCUMENTS

| | | |
|---|---|---|
| 6,589,801 B1 | 7/2003 | Yoon et al. |
| 7,218,093 B2 | 5/2007 | Cirkel et al. |
| 8,110,914 B2 | 2/2012 | Kang et al. |
| 8,557,680 B2 | 10/2013 | Chandrasekaran et al. |
| 8,841,204 B2 | 9/2014 | Wang et al. |
| 9,165,989 B2 | 10/2015 | Bower et al. |
| 9,941,241 B2 | 4/2018 | Edelstein et al. |
| 2006/0164114 A1* | 7/2006 | Cirkel ................ G01R 31/2831 324/750.01 |

(Continued)

*Primary Examiner* — Nelson Garces
(74) *Attorney, Agent, or Firm* — Lee IP Law, PC

(57) ABSTRACT

An inspection system for a semiconductor package includes an inspection apparatus that includes a stage on which the semiconductor package is loaded, and a computer coupled to the inspection apparatus. The semiconductor package may include a first semiconductor chip and a second semiconductor chip on the first semiconductor chip, the computer may provide first identification information about the first semiconductor chip and second identification information about the second semiconductor chip, and the computer may control the inspection apparatus to selectively perform a package test process on one of the first and second semiconductor chips, the one of the first and second semiconductor chips being identified as a good chip based on the first identification information and the second identification information.

20 Claims, 9 Drawing Sheets

(56) References Cited

U.S. PATENT DOCUMENTS

2009/0130821 A1\* 5/2009 Cox ................. H01L 24/94
438/455
2018/0277422 A1 9/2018 Ishizuka et al.
2018/0331070 A1 11/2018 Seidemann et al.

\* cited by examiner

INSPECTION SYSTEM AND METHOD FOR INSPECTING SEMICONDUCTOR PACKAGE, AND METHOD OF FABRICATING SEMICONDUCTOR PACKAGE

CROSS-REFERENCE TO RELATED APPLICATION

Korean Patent Application No. 10-2019-0059215, filed on May 21, 2019, in the Korean Intellectual Property Office, and entitled: "Method of and System for Inspecting Semiconductor Package, and Method of Fabricating Semiconductor Package Using the Same," is incorporated by reference herein in its entirety.

BACKGROUND

1. Field

Embodiments relate to an inspection system and method for inspecting semiconductor package, and a method of fabricating semiconductor package.

2. Description of the Related Art

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board. In the semiconductor industry, high capacity, thinness, and small size of semiconductor devices and electronic products using the same have been demanded and thus various package techniques have been suggested. A wafer level bonding-based semiconductor package has a problem of reduced yield.

SUMMARY

Embodiments are directed to an inspection system for a semiconductor package, the system including an inspection apparatus that includes a stage on which the semiconductor package is loaded, and a computer coupled to the inspection apparatus. The semiconductor package may include a first semiconductor chip and a second semiconductor chip on the first semiconductor chip, the computer may provide first identification information about the first semiconductor chip and second identification information about the second semiconductor chip, and the computer may control the inspection apparatus to selectively perform a package test process on one of the first and second semiconductor chips, the one of the first and second semiconductor chips being identified as a good chip based on the first identification information and the second identification information.

Embodiments are also directed to a method of inspecting a semiconductor package, the method including providing the semiconductor package that includes a first semiconductor chip and a second semiconductor chip on the first semiconductor chip, providing first identification information about the first semiconductor chip and second identification information about the second semiconductor chip, and selectively performing a package test process on one of the first and second semiconductor chips, the one of the first and second semiconductor chips being identified as a good chip based on the first identification information and the second identification information.

Embodiments are also directed to a method of fabricating a semiconductor package, the method including forming the semiconductor package that includes a first semiconductor chip and a second semiconductor chip on the first semiconductor chip, and inspecting the semiconductor package. Inspecting the semiconductor package may include providing first identification information about the first semiconductor chip and second identification information about the second semiconductor chip, and selectively performing a package test process on one of the first and second semiconductor chips, the one of the first and second semiconductor chips being identified as a good chip based on the first identification information and the second identification information.

BRIEF DESCRIPTION OF THE DRAWINGS

Features will become apparent to those of skill in the art by describing in detail example embodiments with reference to the attached drawings in which.

DETAILED DESCRIPTION

The following will now describe in detail some example embodiments with reference to the accompanying drawings.

Figure 1:
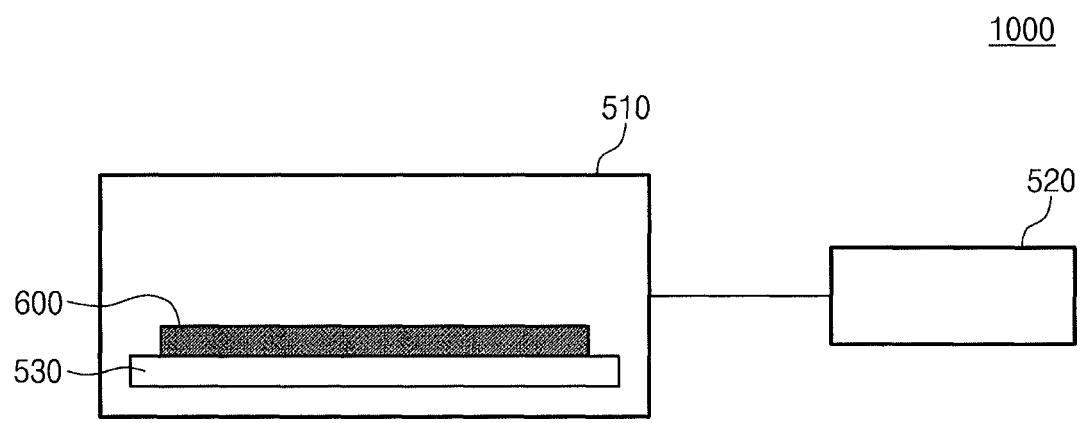
FIG. 1 illustrates a simplified schematic diagram showing an inspection system according to an example embodiment.

FIG. 1 illustrates a simplified schematic diagram showing an inspection system according to an example embodiment.

Referring to FIG. 1, an inspection system 1000 may include an inspection apparatus 510 that performs a package test process on a semiconductor package 600 and a computer 520 associated with or coupled to the inspection apparatus 510. The inspection apparatus 510 may include a stage 530 on which the semiconductor package 600 is loaded, and may be configured to perform the package test process. The package test process may include supplying the semiconductor package 600 with various voltages, electric signals, temperatures, or the like to measure electrical characteristics, functional properties, operating speeds, or the like of the semiconductor package 600. The computer 520 may control the inspection apparatus 510, and may store and process data obtained from the inspection apparatus 510. The computer 520 may be configured to determine whether or not the semiconductor package 600 is good based on the data obtained from the inspection apparatus 510.

The following will describe an inspection method using the inspection system 1000.

Figure 2:
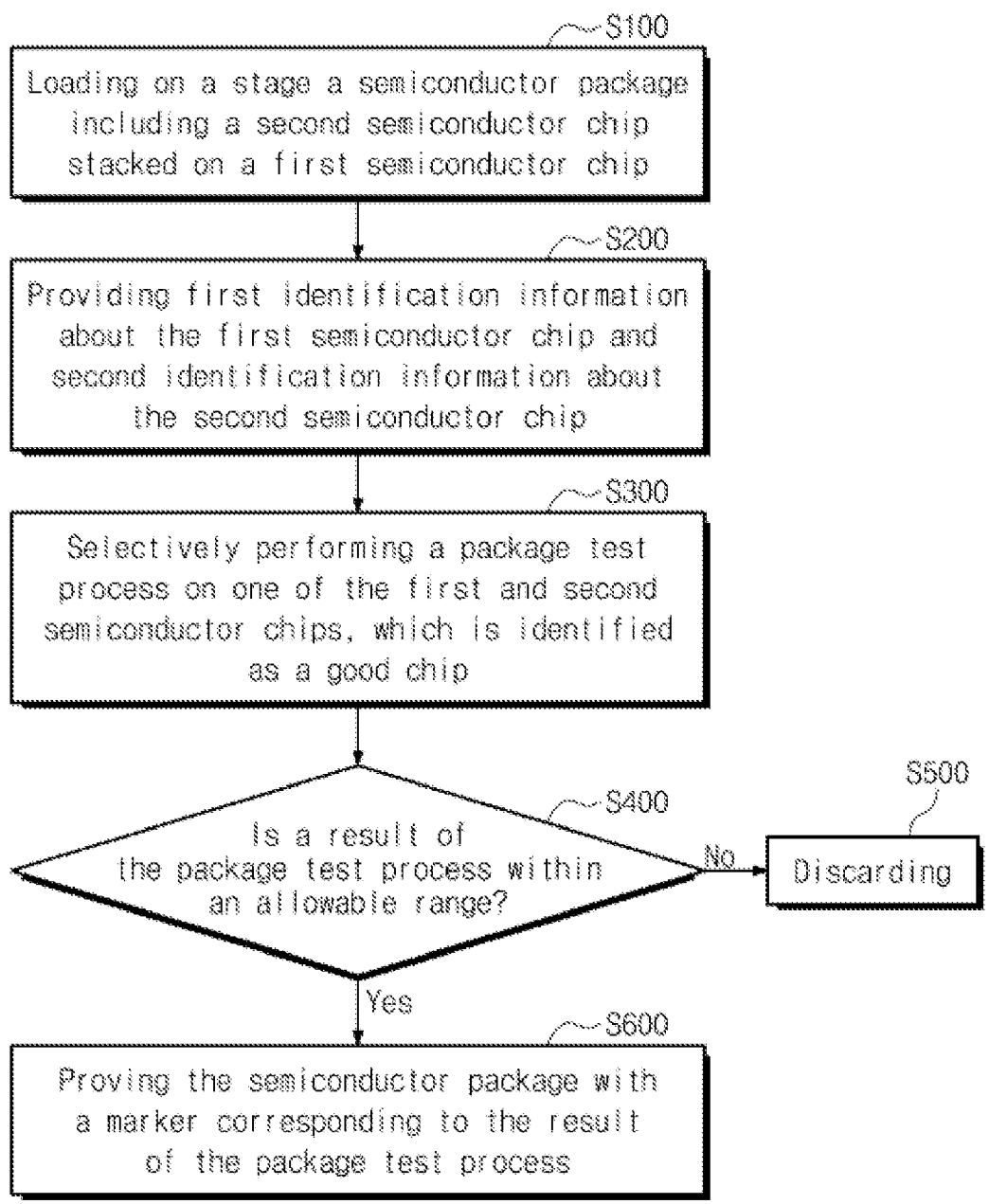
FIG. 2 illustrates a flow chart showing a method of inspecting a semiconductor package, according to an example embodiment.
Figure 3:
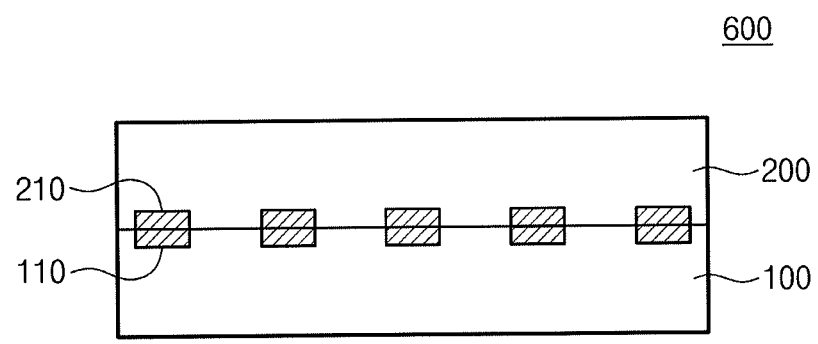
FIGS. 3, 4, and 6 illustrate diagrams showing a method of inspecting a semiconductor package, according to an example embodiment.
Figure 4:
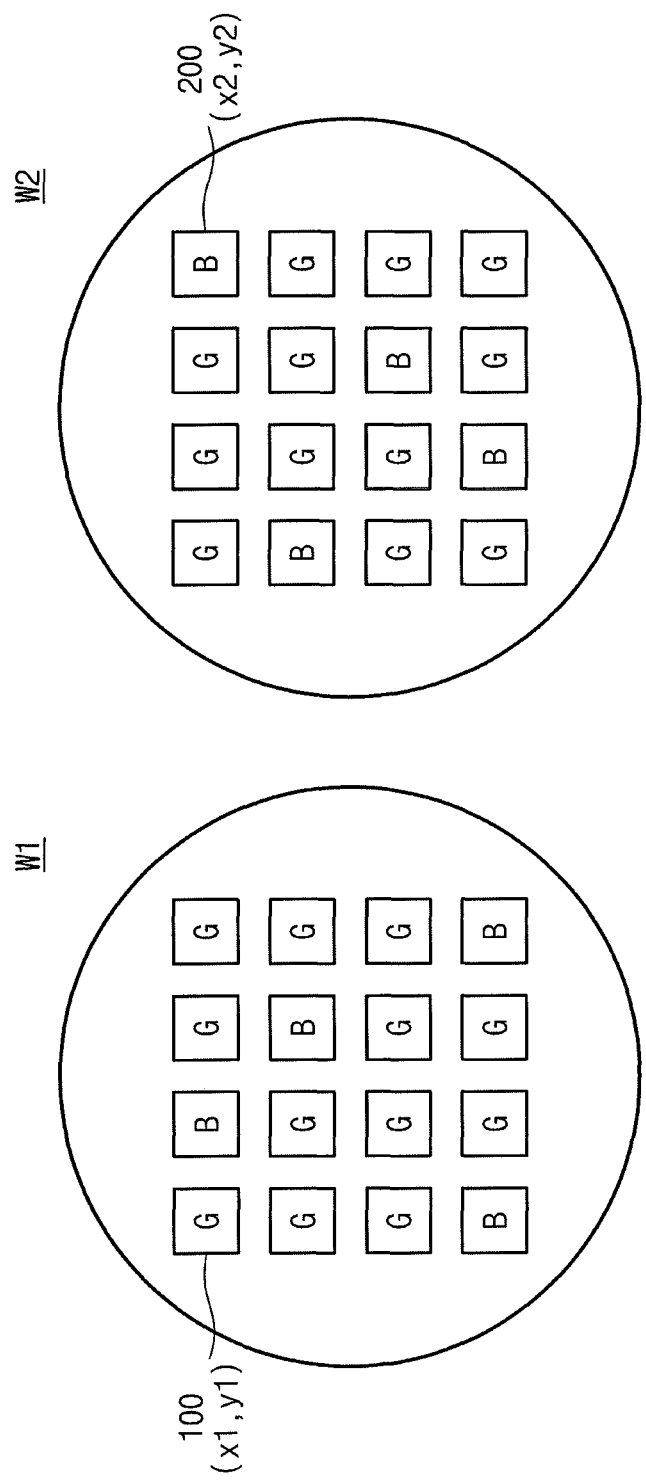
Figure 5:
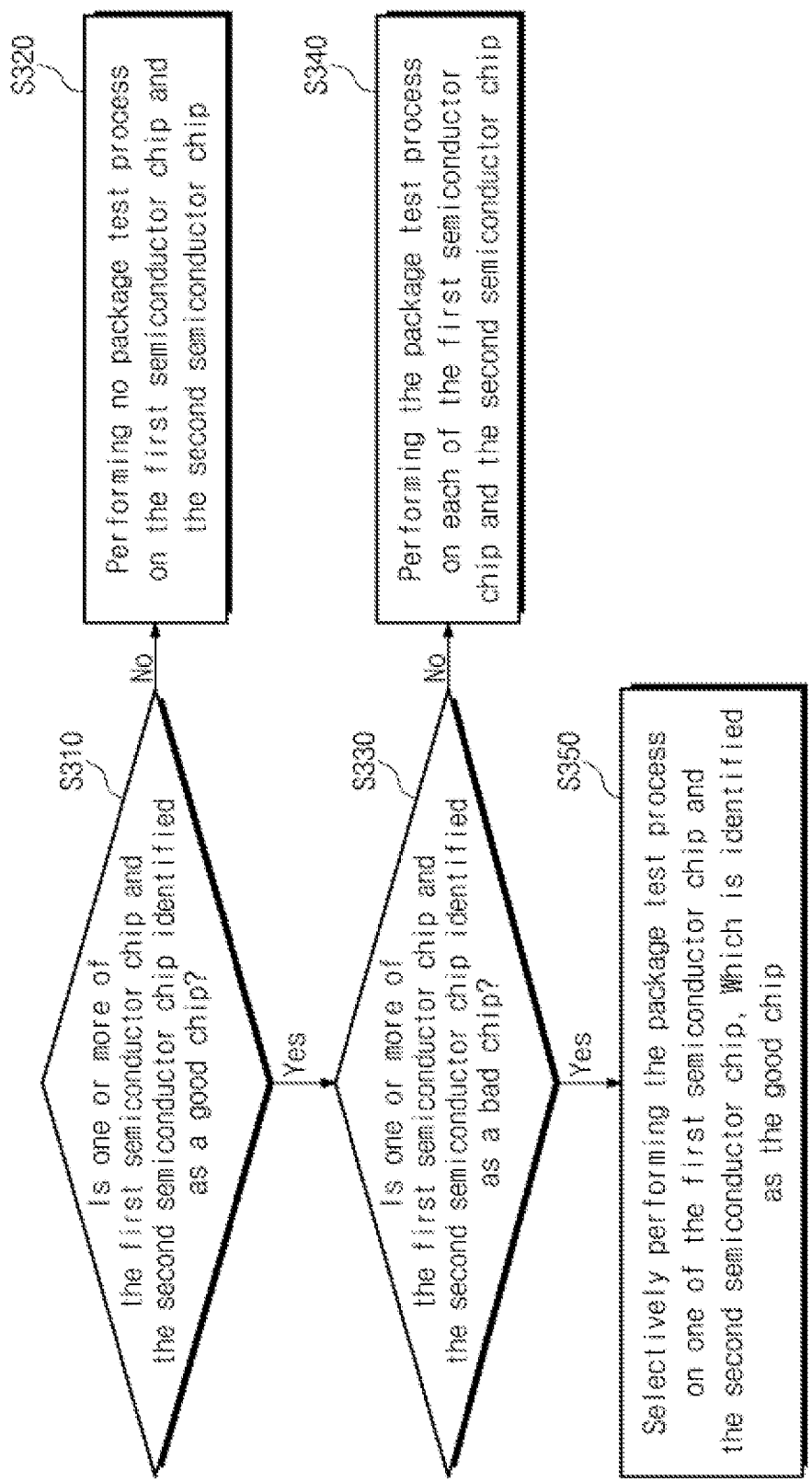
FIG. 5 illustrates a flow chart showing in detail an operation S300 of FIG. 2.
Figure 6:
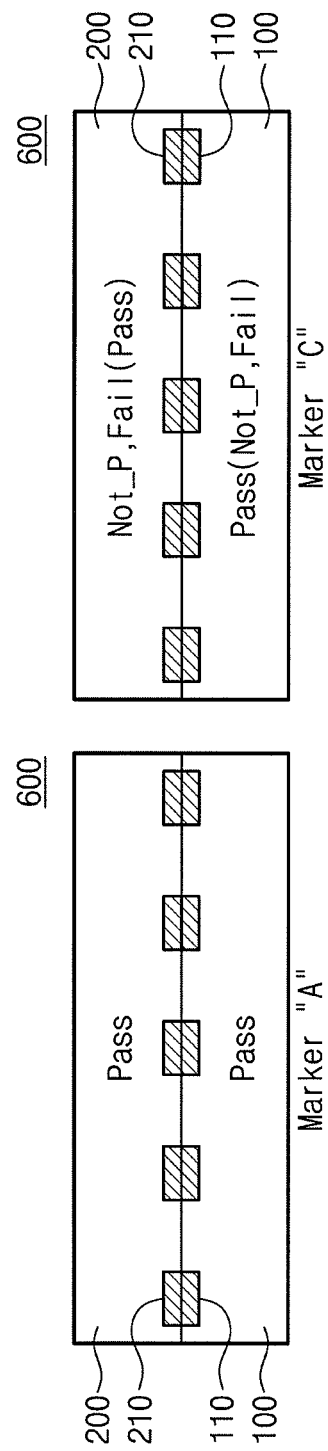

FIG. 2 illustrates a flow chart showing a method of inspecting a semiconductor package using the inspection system 1000 according to an example embodiment. FIGS. 3, 4, and 6 illustrate diagrams showing a method of inspecting a semiconductor package using the inspection system 1000 according to an example embodiment. FIG. 5 illustrates a flow chart showing in detail an operation S300 of FIG. 2.

Referring to FIGS. 2 and 3, a semiconductor package 600 may be provided. The semiconductor package 600 may include a first semiconductor chip 100 and a second semiconductor chip 200 stacked on the first semiconductor chip 100. The first semiconductor chip 100 may include, for example, an integrated circuit (for example, a memory circuit, a logic circuit, or a combination thereof). The first semiconductor chip 100 may be provided on one surface thereof with first bonding pads 110 that are electrically connected to the integrated circuit of the first semiconductor chip 100. The first bonding pads 110 may include a metal, for example, copper.

The second semiconductor chip 200 may include, for example, an integrated circuit (for example, a memory circuit, a logic circuit, or a combination thereof). The second semiconductor chip 200 may be the same as or an identical copy of the first semiconductor chip 100. For example, the second semiconductor chip 200 may have operating properties the same as those of the first semiconductor chip 100. The first semiconductor chip 100 and the second semiconductor chip 200 may be, for example, dynamic random access memory (DRAM) chips. The second semiconductor chip 200 may be provided on one surface thereof with second bonding pads 210 that are electrically connected to the integrated circuit of the second semiconductor chip 200. The second bonding pads 210 may include metal, for example, copper.

The one surface of the first semiconductor chip 100 may face the one surface of the second semiconductor chip 200, and the first bonding pads 110 may be combined with the second bonding pads 210. For example, the second semiconductor chip 200 may be stacked on the first semiconductor chip 100 to allow the second bonding pads 210 to align with the first bonding pads 110, such that the first bonding pads 110 may be directly combined with the second bonding pads 210. In another implementation, the first semiconductor chip 100 and the second semiconductor chip 200 may be provided therebetween with an additional substrate to combine the first bonding pads 110 with the second bonding pads 210. The combination of the first bonding pads 110 with the second bonding pads 210 may electrically connect the first semiconductor chip 100 to the second semiconductor chip 200.

The semiconductor package 600 may be provided into the inspection apparatus 510 of the inspection system 1000 shown in FIG. 1, and may be loaded on the stage 530 in the inspection apparatus 510 (S100).

Referring to FIGS. 2 and 4, the computer 520 of FIG. 1 may provide first identification information about the first semiconductor chip 100 and second identification information about the second semiconductor chip 200.

For example, a first wafer W1 may be provided that includes a plurality of first semiconductor chips 100, and the plurality of first semiconductor chips 100 may be identified based on their relative position on the first wafer W1. For example, the position of each of the plurality of first semiconductor chips 100 may be expressed by an X-Y coordinate on the first wafer W1. Each of the plurality of first semiconductor chips 100 may be identified as a good chip G or a bad chip B. The good chip G and the bad chip B may be data obtained from a result of an electrical die sorting (EDS) test performed on the first wafer W1. The good chip G may indicate a chip that has passed (or has satisfied) the EDS test performed on the first wafer W1, and the bad chip B may indicate a chip that has not passed (or has not satisfied) the EDS test performed on the first wafer W1.

The first semiconductor chip 100 that constitutes the semiconductor package 600 may be one of the plurality of first semiconductor chips 100 of the first wafer W1. In this case, the first identification information may include a relative position data (or an X-Y coordinate) about the first semiconductor chip 100 and a quality data obtained from the EDS test result for the first semiconductor chip 100. For example, the semiconductor package 600 may include one of the plurality of first semiconductor chips 100, which is located on a position expressed by (x1, y1) and is identified as the good chip G. In this case, the first identification information may include a position data represented by (x1, y1) and a quality data or EDS test result expressed by "good chip G".

A second wafer W2 may be provided that includes a plurality of second semiconductor chips 200, and the plurality of second semiconductor chips 200 may be identified based on their relative position on the second wafer W2. For example, the position of each of the plurality of second semiconductor chips 200 may be expressed by an X-Y coordinate on the second wafer W2. Each of the plurality of second semiconductor chips 200 may be identified as a good chip G or a bad chip B. The good chip G and the bad chip B may be data obtained from a result of an electrical die sorting (EDS) test performed on the second wafer W2. The good chip G may indicate a chip that has passed (or has satisfied) the EDS test performed on the second wafer W2, and the bad chip B may indicate a chip that has not passed (or has not satisfied) the EDS test performed on the second wafer W2.

The second semiconductor chip 200 included in the semiconductor package 600 may be one of the plurality of second semiconductor chips 200 of the second wafer W2. In this case, the second identification information may include a relative position data (or an X-Y coordinate) about the second semiconductor chip 200 and a quality data obtained from the EDS test result for the second semiconductor chip 200. For example, the semiconductor package 600 may include one of the plurality of second semiconductor chip 200, which is located on a position expressed by (x2, y2) and is identified as the bad chip B. In this case, the second identification information may include a position data represented by (x2, y2) and a quality data expressed by "bad chip B".

The first identification information about the first semiconductor chip 100 and the second identification information about the second semiconductor chip 200 may be pre-stored in the computer 520 of FIG. 1.

Referring back to FIGS. 2 and 3, a package test process may be selectively performed on a semiconductor chip identified as a good chip G, among the first and second semiconductor chips 100 and 200. Based on the first identification information and the second identification information, the computer 520 of FIG. 1 may identify whether each of the first and second semiconductor chips 100 and 200 is a good chip G or a bad chip B. The computer 520 of FIG. 1 may control the inspection apparatus 510 of FIG. 1 to selectively perform the package test process on a certain semiconductor chip that is identified as the good chip G based on the first identification information and the second identification information. The package test process may include measuring electrical characteristics, functional properties, operating speeds, or the like of the semiconductor chip by supplying various voltages, electric signals, temperatures, or the like to the semiconductor chip included in the semiconductor package 600.

For example, referring to FIGS. 3 and 5, based on the first identification information and the second identification information, the computer 520 of FIG. 1 may determine whether one or more of the first semiconductor chip 100 and the second semiconductor chip 200 are identified as a good chip G (S310). When the first semiconductor chip 100 and the second semiconductor chip 200 are all identified as a bad chip B, no package test process may be performed on the first semiconductor chip 100 and the second semiconductor chip 200 (S320). In this case, the computer 520 of FIG. 1 may control the inspection apparatus 510 to perform no package test process on the first and second semiconductor chips 100 and 200.

When one or more of the first semiconductor chip 100 and the second semiconductor chip 200 are identified as a good chip G, the computer 520 of FIG. 1 may determine whether one of the first semiconductor chip 100 and the second semiconductor chip 200 is identified as a bad chip B based on the first identification information and the second identification information (S330). When the first semiconductor chip 100 and the second semiconductor chip 200 are both identified as a good chip G, the package test process may be performed on each of the first semiconductor chip 100 and the second semiconductor chip 200 (S340). In this case, the computer 520 of FIG. 1 may control the inspection apparatus 510 to perform the package test process on each of the first and second semiconductor chips 100 and 200.

When one of the first semiconductor chip 100 and the second semiconductor chip 200 is identified as a bad chip B, the package test process may be selectively performed on other one of the first semiconductor chip 100 and the second semiconductor chip 200, which is identified as the good chip G (S350). The computer 520 of FIG. 1 may control the inspection apparatus 510 of FIG. 1 to selectively perform the package test process on the other one of the first semiconductor chip 100 and the second semiconductor chip 200, which is identified as a good chip G. For example, when the first semiconductor chip 100 is identified as a good chip G based on the first identification information, and when the second semiconductor chip 200 is identified as a bad chip B based on the second identification information, the package test process may be selectively performed on the first semiconductor chip 100, but not on the second semiconductor chip 200.

Referring to FIGS. 2 and 6, it may be determined that whether or not a result of the package test process on the semiconductor package 600 falls within an allowable or predetermined range (S400). When the result of the package test process on the semiconductor package 600 is out of the allowable or predetermined range, the semiconductor package 600 may be discarded (S500). For example, the semiconductor package 600 may be discarded either when no package test process is performed on the first semiconductor chip 100 and the second semiconductor chip 200 that are all identified as the bad chip B (S320 of FIG. 5) or when neither the first semiconductor chip 100 nor the second semiconductor chip 200 passes the package test process.

When the result of the package test process on one or more of the first and second semiconductor chips 100 and 200 is within the allowable or predetermined range, the semiconductor package 600 may be provided with a marker (for example, by marking the semiconductor package 600 with a physical attribute or visual mark, for example, using a laser, or by making another change to the semiconductor package 600 such as opening or blowing an internal fuse, etc.) that corresponds to the result of the package test process (S600). For example, the results of the package test processes on both the first semiconductor chip 100 and the second semiconductor chip 200 are within the allowable or predetermined range, a first marker A may be provided to the semiconductor package 600. Thus, when all of the first semiconductor chip 100 and the second semiconductor chip 200 pass the package test process ("Pass"), the first marker A may be provided to the semiconductor package 600.

When the result of the package test process on one of the first and second semiconductor chips 100 and 200 is within the allowable or predetermined range, and when the result of the package test process on other one of the first and second semiconductor chips 100 and 200 is out of the allowable predetermined range, a second marker C may be provided to the semiconductor package 600. For example, when the first semiconductor chip 100 (or the second semiconductor chip 200) passes the package test process (see "Pass" of FIG. 6), and when no package test process is performed on the second semiconductor chip 200 (or the first semiconductor chip 100) identified as the bad chip B (see "Not_P" of FIG. 6), the second marker C may be provided to the semiconductor package 600. In certain embodiments, even when the first semiconductor chip 100 (or the second semiconductor chip 200) passes the package test process (see "Pass" of FIG. 6) and when the second semiconductor chip 200 (or the first semiconductor chip 100) fails to pass the package test process (see "Fail" of FIG. 6), the second marker C may be provided to the semiconductor package 600.

The second marker C may be different from the first marker A. The first marker A and the second marker C may represent information about performance (and/or capability) of the semiconductor package 600. For example, in the semiconductor package 600 provided with the second marker C, only one of the semiconductor chips 100 and 200 may pass the package test process. Thus, the semiconductor package 600 provided with the second marker C may have performance (and/or capability) less than that of the semiconductor package 600 provided with the first marker A.

In general, for a semiconductor package that includes a plurality of stacked semiconductor chips, a general package test process may be performed on the semiconductor package such that each and every one of the plurality of semiconductor chips is tested and, if any one of the plurality of semiconductor chips fails to pass the package test process, the semiconductor package may be discarded or rejected. Such an approach may decrease yields and increase manufacturing costs.

According to the present example embodiment, when the package test process is performed on the semiconductor package 600, the first identification information and the second identification information, for example, from the EDS test result for the first and second semiconductor chips 100 and 200, may be used and the package test process may be selectively performed on one or both among the first and second semiconductor chips 100 and 200 identified as a good chip G based on the first identification information and the second identification information, whereas no package test process may be performed on one or both of the first and second semiconductor chips 100 and 200 identified as a bad chip B based on the first identification information and the second identification information. Accordingly, even when a bad chip is included in a plurality of semiconductor chips that constitute the semiconductor package 600, the semiconductor package 600 may pass the package test process, for example, as a qualified pass, and then may not be discarded.

Thus, as described above, for example, when all of the plurality of semiconductor chips that constitute the semiconductor package 600 pass the package test process, the semiconductor package 600 may be provided with the first marker A, and when only one of the plurality of semiconductor chips that constitute the semiconductor package 600 passes the package test process, the semiconductor package 600 may be provided with the second marker C different from the first marker A. Therefore, even when a bad chip is included in the plurality of semiconductor chips that constitute the semiconductor package 600, the semiconductor package 600 may be practically used. As a result, the semiconductor package 600 manufacturing process may increase in yield and decrease manufacturing costs.

Figure 7:
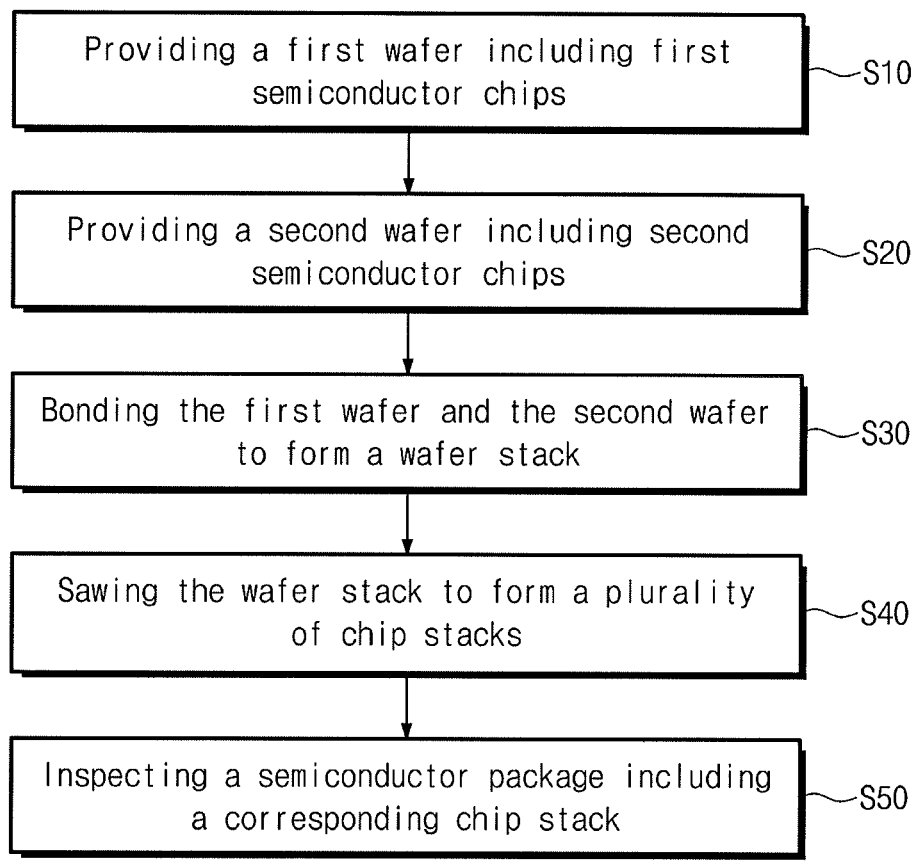
FIG. 7 illustrates a flow chart showing a method of fabricating a semiconductor package, according to an example embodiment.
Figure 8:
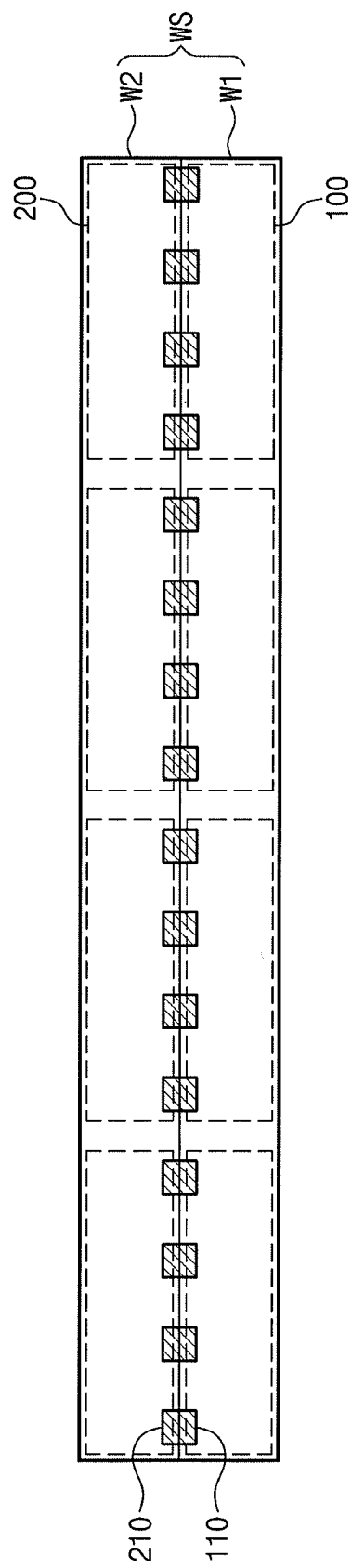
FIGS. 8 and 9 illustrate diagrams showing a method of fabricating a semiconductor package, according to example embodiments.
Figure 9:
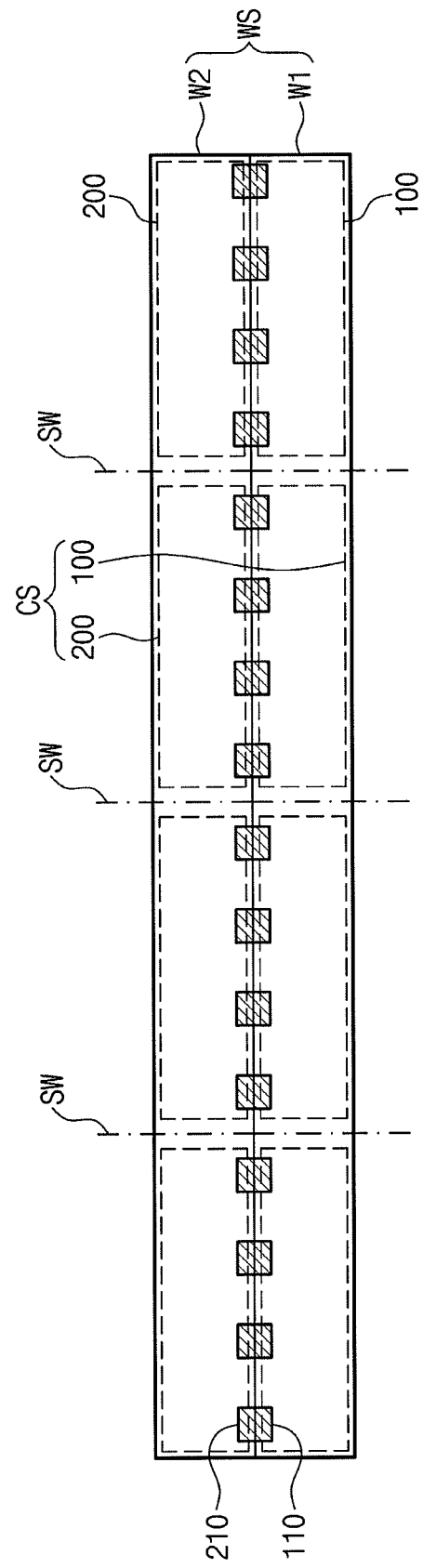

FIG. 7 illustrates a flow chart showing a method of fabricating a semiconductor package, according to an example embodiment. FIGS. 8 and 9 illustrate diagrams showing a method of fabricating a semiconductor package, according to example embodiments.

Referring to FIGS. 7 and 8, a first wafer W1 may be provided that includes a plurality of first semiconductor chips 100 (S10). Each of the plurality of first semiconductor chips 100 may include, for example, an integrated circuit (for example, a memory circuit, a logic circuit, or a combination thereof). The first wafer W1 may be provided on one surface thereof with first bonding pads 110 that are electrically connected to the integrated circuit of each of the plurality of first semiconductor chips 100.

A second wafer W2 may be provided that includes a plurality of second semiconductor chips 200 (S20). Each of the plurality of second semiconductor chips 200 may include, for example, an integrated circuit (for example, a memory circuit, a logic circuit, or a combination thereof). The plurality of second semiconductor chips 200 may be the same semiconductor chip (for example, a semiconductor chip having the same operating characteristics) as that of the plurality of first semiconductor chips 100. The second wafer W2 may be provided on one surface thereof with second bonding pads 210 that are electrically connected to the integrated circuit of each of the plurality of second semiconductor chips 200.

The second wafer W2 may be bonded to the first wafer W1, such that a wafer stack WS may be formed (S30). In an example embodiment, a direct bonding process may be performed to bond the first and second wafers W1 and W2 to each other. For example, the second wafer W2 may be stacked on the first wafer W1 to allow the second bonding pads 210 to align with the first bonding pads 110, and an annealing process may be performed on the stacked first and second wafers W1 and W2. The annealing process may combine the first bonding pads 110 with the second bonding pads 210. In another embodiment, the first wafer W1 and the second wafer W2 may be provided therebetween with an additional substrate to combine the first bonding pads 110 with the second bonding pads 210. The combination of the first bonding pads 110 with the second bonding pads 210 may electrically connect the plurality of first semiconductor chips 100 to corresponding plurality of second semiconductor chips 200.

Referring to FIGS. 7 and 9, the wafer stack WS may be diced to form a plurality of chip stacks CS (S40). A sawing process SW may be performed to divide the wafer stack SW into the plurality of chip stacks CS. Each chip stack CS may include one of the plurality of first semiconductor chips 100 and one of the plurality of second semiconductor chips 200. A molding layer may be formed on each chip stack CS to fabricate the semiconductor package 600 discussed with reference to FIG. 3. The semiconductor package 600 may include a corresponding one of the chip stacks CS, and the corresponding one of the chip stacks CS may include a corresponding one of the plurality of first semiconductor chips 100 and a corresponding one of the plurality of second semiconductor chips 200. The second semiconductor chip 200 may be stacked on the first semiconductor chip 100.

The semiconductor package 600 may be inspected (S50). The inspection of the semiconductor package 600 may be performed using the inspection system 1000 of FIG. 1 and the inspection method discussed with reference with FIGS. 2 to 6. For example, the semiconductor package 600 may be provided into the inspection apparatus 510 of the inspection system 1000 of FIG. 1, and may be loaded on the stage 530 in the inspection apparatus 510 (S100). The computer 520 of FIG. 1 may provide the first identification information about the first semiconductor chip 100 and the second identification information about the second semiconductor chip 200 (S200), and the package test process may be selectively performed on one or both of the first and second semiconductor chips 100 and 200 identified as a good chip G based on the first identification information and the second identification information (S300). It may be determined that whether or not a result of the package test process on the semiconductor package 600 is within an allowable or predetermined range (S400), and when the result of the package test process on one or more of the first and second semiconductor chips 100 and 200 is within the allowable or predetermined range, the semiconductor package 600 may be provided with a marker that corresponds to the result of the package test process (S600).

According to the present example embodiment, when the package test process is performed on the semiconductor package 600, the first identification information and the second identification information obtained from the EDS test result for the first and second semiconductor chips 100 and 200 may be used. The package test process may be selectively performed on one or both of the first and second semiconductor chips 100 and 200 identified as a good chip G based on the first identification information and the second identification information. Accordingly, even when a bad chip is included in a plurality of semiconductor chips that constitute the semiconductor package 600, the semiconductor package 600 may pass the package test process and then classified, for example, as a qualified pass, as a practical semiconductor package. As a result, a wafer-level bonding-based semiconductor package fabrication process may increase in yield and decrease in manufacturing cost.

As described above, example embodiments may provide a method of and system for inspecting a semiconductor package, which method and system may increase yield of the semiconductor package. Example embodiments may provide a method of fabricating a semiconductor package, which method may increase yield and reducing cost.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An inspection system for a semiconductor package, the system comprising:
    an inspection apparatus that includes a stage on which the semiconductor package is loaded; and
    a computer coupled to the inspection apparatus,
    wherein
    the semiconductor package includes a first semiconductor chip and a second semiconductor chip on and electrically connected to the first semiconductor chip,
    the computer provides first identification information about the first semiconductor chip and second identification information about the second semiconductor chip, and
    the computer controls the inspection apparatus to selectively perform a package test process on one of the first and second semiconductor chips in the semiconductor package, based on the first identification information and the second identification information, selectively performing the package test process including:
    when the first semiconductor chip is identified as a good chip based on the first identification information, and when the second semiconductor chip is identified as a bad chip based on the second identification information, performing the package test process on the first semiconductor chip in the semiconductor package and not performing the package test process on the second semiconductor chip in the semiconductor package.

2. The system of claim 1, wherein
    the first identification information includes data obtained from an electrical die sorting (EDS) test for the first semiconductor chip,
    the second identification information includes data obtained from a result of an EDS test for the second semiconductor chip, and
    the first identification information and the second identification information are pre-stored in the computer.

3. The system of claim 1, wherein
    when the first semiconductor chip is identified as a good chip based on the first identification information, and when the second semiconductor chip is identified as a bad chip based on the second identification information, the computer controls the inspection apparatus to selectively perform the package test process on the first semiconductor chip in the semiconductor package.

4. The system of claim 3, wherein
    when the first semiconductor chip is identified as a good chip based on the first identification information, and when the second semiconductor chip is identified as a good chip based on the second identification information, the computer controls the inspection apparatus to perform the package test process on each of the first and second semiconductor chips in the semiconductor package.

5. The system of claim 3, wherein
    when the first semiconductor chip is identified as a bad chip based on the first identification information, and when the second semiconductor chip is identified as a bad chip based on the second identification information, the computer controls the inspection apparatus to perform no package test process on the first and second semiconductor chips in the semiconductor package.

6. A method of inspecting a semiconductor package, the method comprising:
    providing the semiconductor package that includes a first semiconductor chip and a second semiconductor chip on the first semiconductor chip, the first semiconductor chip being electrically connected to the second semiconductor chip in the semiconductor package;
    providing first identification information about the first semiconductor chip and second identification information about the second semiconductor chip; and
    selectively performing a package test process on the first and second semiconductor chips in the semiconductor package, based on the first identification information and the second identification information, selectively performing the package test process including:
    when at least one of the first and second semiconductor chips is identified as a good chip based on the first identification information and the second identification information, performing the package test process on the at least one of the first and second semiconductor chips, and
    when each of the first and second semiconductor chips is identified as a bad chip based on the first identification information and the second identification information, not performing the package test process on the first and second semiconductor chips in the semiconductor package.

7. The method of claim 6, wherein
    the first identification information includes data obtained from an electrical die sorting (EDS) test for the first semiconductor chip, and
    the second identification information includes data obtained from a result of an EDS test for the second semiconductor chip.

8. The method of claim 6, wherein selectively performing the package test process includes
    when the first semiconductor chip is identified as a good chip based on the first identification information, and when the second semiconductor chip is identified as a bad chip based on the second identification information, selectively performing the package test process on the first semiconductor chip.

9. The method of claim 8, wherein selectively performing the package test process further includes
    when the first semiconductor chip is identified as a good chip based on the first identification information, and when the second semiconductor chip is identified as a good chip based on the second identification information, performing the package test process on each of the first and second semiconductor chips in the semiconductor package.

10. The method of claim 6, wherein
the semiconductor package further includes a first bonding pad on a surface of the first semiconductor chip and a second bonding pad on a surface of the second semiconductor chip, and the first semiconductor chip and the second semiconductor chip are connected through the first bonding pad and the second bonding pad.

11. The method of claim 6, further comprising providing the semiconductor package with a marker that corresponds to a result of the package test process.

12. The method of claim 11, wherein providing the semiconductor package with the marker includes:
when results of the package test process on the first and second semiconductor chips in the semiconductor package are within a predetermined range, providing the semiconductor package with a first marker; and
when a result of the package test process on the first semiconductor chip in the semiconductor package is within the predetermined range, and when a result of the package test process on the second semiconductor chip in the semiconductor package is out of the predetermined range, providing the semiconductor package with a second marker,
wherein the first marker is different from the second marker.

13. The method of claim 6, wherein the first semiconductor chip and the second semiconductor chip are the same semiconductor chips.

14. A method of fabricating a semiconductor package, the method comprising:
forming the semiconductor package that includes a first semiconductor chip and a second semiconductor chip on and electrically connected to the first semiconductor chip; and
inspecting the semiconductor package,
wherein inspecting the semiconductor package includes:
providing first identification information about the first semiconductor chip and second identification information about the second semiconductor chip; and
selectively performing a package test process on at least one of the first and second semiconductor chips in the semiconductor package, based on the first identification information and the second identification information, selectively performing the package test process including:
when the first semiconductor chip is identified as a good chip based on the first identification information, and when the second semiconductor chip is identified as a bad chip based on the second identification information, performing the package test process on the first semiconductor chip in the semiconductor package and not performing the package test process on the second semiconductor chip in the semiconductor package.

15. The fabricating method of claim 14, wherein forming the semiconductor package includes:
providing a first wafer that includes a plurality of first semiconductor chips;
providing a second wafer that includes a plurality of second semiconductor chips;
bonding the first and second wafers to form a wafer stack; and
performing a sawing process to divide the wafer stack into a plurality of chip stacks,
wherein
the semiconductor package includes a corresponding chip stack of the plurality of chip stacks, and
the corresponding chip stack includes the first semiconductor chip among the plurality of first semiconductor chips and the second semiconductor chip among the plurality of second semiconductor chips.

16. The fabricating method of claim 14, further comprising providing the semiconductor package with a marker that corresponds to a result of the package test process.

17. The fabricating method of claim 16, wherein providing the semiconductor package with the marker includes:
when results of the package test process on the first and second semiconductor chips are within a predetermined range, providing the semiconductor package with a first marker; and
when a result of the package test process on the first semiconductor chip in the semiconductor package is within the predetermined range, and when a result of the package test process on the second semiconductor chip in the semiconductor package is out of the predetermined range, providing the semiconductor package with a second marker,
wherein the first marker is different from the second marker.

18. The fabricating method of claim 14, wherein the first semiconductor chip and the second semiconductor chip are the same semiconductor chips.

19. The fabricating method of claim 14, wherein
the first identification information includes data obtained from an electrical die sorting (EDS) test for the first semiconductor chip, and
the second identification information includes data obtained from a result of an EDS test for the second semiconductor chip.

20. The fabricating method of claim 14, wherein selectively performing the package test process includes
when the first semiconductor chip is identified as the good chip based on the first identification information, and when the second semiconductor chip is identified as a bad chip based on the second identification information, selectively performing the package test process on the first semiconductor chip in the semiconductor package.

* * * * *